United States Patent
Huber et al.

(10) Patent No.: US 10,114,093 B2
(45) Date of Patent: Oct. 30, 2018

(54) METHOD FOR EXTRACTING INFORMATION ENCODED IN A RESULT OF AN NMR MEASUREMENT

(71) Applicant: Numares AG, Regensburg (DE)

(72) Inventors: Fritz Huber, Regensburg (DE); Volker Pfahlert, Kandern (DE)

(73) Assignee: numares AG, Regensburg (DE)

( * ) Notice: Subject to any disclaimer, the term of this patent is extended or adjusted under 35 U.S.C. 154(b) by 0 days.

(21) Appl. No.: 15/510,484

(22) PCT Filed: Sep. 11, 2015

(86) PCT No.: PCT/EP2015/070837
§ 371 (c)(1),
(2) Date: Mar. 10, 2017

(87) PCT Pub. No.: WO2016/038190
PCT Pub. Date: Mar. 17, 2016

(65) Prior Publication Data
US 2017/0261576 A1    Sep. 14, 2017

(30) Foreign Application Priority Data
Sep. 12, 2014  (DE) ......... 10 2014 218 354

(51) Int. Cl.
*G01R 33/46*    (2006.01)
*G01R 33/465*   (2006.01)

(52) U.S. Cl.
CPC ....... *G01R 33/4625* (2013.01); *G01R 33/465* (2013.01)

(58) Field of Classification Search
CPC .............. G01R 33/465; G01R 33/4625; G01R 33/4828; G01R 33/5608; G01R 33/58
See application file for complete search history.

(56) References Cited

U.S. PATENT DOCUMENTS

2005/0222504 A1  10/2005 Otvos et al.
2007/0264677 A1  11/2007 Otvos
(Continued)

FOREIGN PATENT DOCUMENTS

CN   1063360 A    8/1992
CN   101173918 A  5/2008
(Continued)

OTHER PUBLICATIONS

Savorani, Francesco, Giorgio Tomasi, and Søren Balling Engelsen. "icoshift: A versatile tool for the rapid alignment of 1D NMR spectra." Journal of Magnetic Resonance 202.2 (2010): 190-202.*
English translation of JP 2006-337354 provided by Espacenet.*
Malz et al.; "Validation of quantitative NMR"; Journal of Pharmaceutical and Biomedical Analysis; 2005; pp. 813-823; vol. 38.
Schonberger et al.; "Guide to NMR Method Development and Validation—Part I: Identification and Quantification, Technical Report No. Jan. 2014"; May 2014; pp. 1-20.
(Continued)

*Primary Examiner* — Rishi Patel
(74) *Attorney, Agent, or Firm* — The Webb Law Firm

(57) ABSTRACT

A method for extracting information encoded in a result of an NMR measurement, including the following steps: providing a first result of an NMR measurement of a sample; providing a second result of an NMR measurement of a calibration sample; calculating a conversion factor being indicative for a dependency between encoded information on the calibration sample and the concentration of at least one constituent of the calibration sample, applying the conversion factor to information encoded in the first result, calculating a validity value for a subset of the encoded information of the first result, the validity value being representative for a fitness of a first subset of the encoded information to be separated from a second subset of the encoded information, and assigning the validity value to the subset of the encoded information for which it was calculated.

5 Claims, 1 Drawing Sheet

| Information Subset | Mean chemical shift/ppm | Validity value | Concentration/ (mmol/l) |
|---|---|---|---|
| A | 1.174 | 0.90 | 1.1 |
| B | 1.310 | 0.95 | 4.2 |
| C | 2.132 | 0.97 | 3.5 |
| D | 2.198 | 0.91 | 2.1 |
| E | 2.330 | 0.85 | 1.6 |
| F | 2.513 | 0.76 | 0.4 |
| G | 2.767 | 0.78 | 8.5 |
| H | 3.096 | 0.93 | 4.2 |
| I | 3.105 | 0.95 | 1.5 |
| J | 3.222 | 0.97 | 3.6 |
| K | 3.378 | 0.91 | 5.1 |

(56) References Cited

U.S. PATENT DOCUMENTS

| | | | |
|---|---|---|---|
| 2008/0077374 A1 | 3/2008 | Laczko | |
| 2011/0004453 A1 | 1/2011 | Engelsen et al. | |
| 2013/0131992 A1* | 5/2013 | Wilkes | G01R 33/4625 702/19 |
| 2013/0265047 A1* | 10/2013 | Griswold | G01R 33/56 324/309 |
| 2014/0156573 A1 | 6/2014 | Szyperski et al. | |

FOREIGN PATENT DOCUMENTS

| | | | |
|---|---|---|---|
| CN | 101479619 A | 7/2009 |
| EP | 2270530 A1 | 1/2011 |
| JP | 2006337354 A | 12/2006 |
| WO | 9211807 A1 | 7/1992 |

OTHER PUBLICATIONS

Lindon et al., "Spectroscopic and Statistical Techniques for Information Recovery in Metabonomics and Metabolomics"; Annual Review of Analytic Chemistry, 2008, pp. 45-69; Ch. 1, www.annualreviews.org.

Spraul et al., "Automatic reduction of NMR spectroscopic data for statistical and pattern recognition classification of samples", Journal of Pharmaceutical & Biomedical Analysis, 1994, pp. 1215-1225, vol. 12:10, Elsevier Science Ltd., Great Britain.

Spraul et al., "NMR-Based Multi Parametric Quality Control of Fruit Juices: SGF Profiling", Nutrients, 2009, pp. 148-155, vol. 1, www.mdpi.com/journal/nutrients.

Sugimoto; "How to determine the absolute purities of target organic compounds—Development of quantitative NMR (q-NMR)"; Folia Pharmacal; 2011; pp. 232-236; vol. 137; Japan; English-language Abstract attached.

* cited by examiner

| Information Subset | Mean chemical shift/ppm | Validity value | Concentration/ (mmol/l) |
|---|---|---|---|
| A | 1.174 | 0.90 | 1.1 |
| B | 1.310 | 0.95 | 4.2 |
| C | 2.132 | 0.97 | 3.5 |
| D | 2.198 | 0.91 | 2.1 |
| E | 2.330 | 0.85 | 1.6 |
| F | 2.513 | 0.76 | 0.4 |
| G | 2.767 | 0.78 | 8.5 |
| H | 3.096 | 0.93 | 4.2 |
| I | 3.105 | 0.95 | 1.5 |
| J | 3.222 | 0.97 | 3.6 |
| K | 3.378 | 0.91 | 5.1 |

US 10,114,093 B2

METHOD FOR EXTRACTING INFORMATION ENCODED IN A RESULT OF AN NMR MEASUREMENT

CROSS-REFERENCE TO RELATED APPLICATIONS

This application is the United States national phase of International Application No. PCT/EP2015/070837 filed Sep. 11, 2015, and claims priority to German Patent Application No. 10 2014 218 354.5 filed Sep. 12, 2014, the disclosures of which are hereby incorporated in their entirety by reference.

BACKGROUND OF THE INVENTION

Field of the Invention

The invention relates to a method for extracting information encoded in a result of an NMR measurement and to an NMR measuring method making use of the method for extracting information.

Description of Related Art

Up to the present days, it is still a challenge to extract information encoded in the result of an NMR measurement. Prior art methods therefore often rely on graphically representing the result of an NMR measurement in form of an NMR spectrum. This spectrum is then evaluated by a person skilled in the art having long-term experience in spectra evaluation. The person skilled in the art can then decide which of the observed lines in the NMR spectrum can be assigned to a specific substance. In doing so, often comparisons are drawn with previously obtained NMR spectra of pure substances.

According to prior art techniques, it is also the task of an experienced person skilled in the art to decide which of the lines observed in an NMR spectrum are to be considered as "good" lines that can be relied upon. Thus, there are many manual steps to be taken when properly evaluating the result of an NMR measurement, wherein most of those steps require manual work of an experienced person skilled in the art.

SUMMARY OF THE INVENTION

It is an object of the instant invention to provide a method for automatically extracting information encoded in a result of an NMR measurement.

This object is achieved by a method as described herein. Such a method for extracting information encoded in a result of an NMR measurement allows for automatically extracting such information and comprises the steps explained in the following. In a first step a first result of an NMR measurement of a sample is provided. The sample contains at least one constituent. The sample can, e.g., be a body fluid sample such as blood, urine, cerebrospinal fluid etc. However, the instant method is not restricted to extract information obtained from a body fluid sample.

The first result comprises encoded information on the sample. Thereby, this encoded information can be divided into subsets.

In the second step, a second result of an NMR measurement of a calibration sample is provided. This calibration sample contains at least one constituent of a known concentration. The second result comprises encoded information on the calibration sample and its constituent(s).

It should be noted that the first step can be done prior to the second step. Alternatively, the second step can be done prior to the first step. For performing the instantly described method, no specific order of those steps is necessary.

After having provided the second result, a conversion factor is calculated. This conversion factor is indicative for dependency between the encoded information on the calibration sample and the concentration of the at least one constituent of the calibration sample. Thus, the conversion factor can account for NMR measurement device specifications since these specifications are encoded in the second result as inherent part of the encoded information on the calibration sample.

Subsequently, the calculated conversion factor is applied to the encoded information of the first result. This can be achieved by multiplying the first result by the conversion factor. Thus, the conversion factor can be seen as a factor to scale the first result so as to achieve a standardization of the first result by considering NMR measurement device specifications that are encoded in the conversion factor and can thus be considered or corrected by using the conversion factor.

Subsequently, a validity value is calculated for a part or all of the encoded information of the first result. For this purpose, the encoded information is divided into different subsets. A subset can be an arbitrarily chosen part of the encoded information, e.g., a part that relates to a specific group of proton signals of the at least one constituent of the sample.

The validity value is representative for a fitness of a first subset of the encoded information to be separated from a second subset of the encoded information. Thus, the validity value indicates if the different regarded subsets can be well distinguished from each other or not. If the first subset relates to a first group of proton signals and the second subset relates to a second group of proton signals, this method step allows to assign a validity value to the first subset indicating its distinctness or distinguishing ability from the second subset.

Finally, the validity value is assigned to the subset of the encoded information for which it was calculated. Thus, the final result is a representation of individual subsets of the information on the sample, which information is encoded in the first result, wherein an individual validity value is assigned to each subset of information. Thereby, all subsets can sum up to the whole information encoded in the first result or only to a part of the information encoded in the first result.

Expressed in other words, the validity value is a measure for the information on the sample that is extractable from the first result. The validity value does not indicate the difference between areas of two curves that do not superimpose each other after a fitting operation. Rather, the validity value indicates whether a mathematic solution of a certain problem is well chosen or whether another mathematic solution of the same problem would be equally good. If the solution is well chosen, the validity value is high. If another mathematical solution would be equally good or only slightly worse, the validity value is low. If one imagined all possible solutions for an underlying problem (i.e. for separating information from each other) on an energy landscape, the validity value can be seen as a measure whether a local or an absolute minimum in the energy landscape is reached by the chosen solution or assignment of a specific part of the information encoded in the first result to a certain subset of information.

Thus, the validity value is a measure for the reliability and the significance of the regarded information subset.

In an embodiment, the method additionally comprises a step of generating a list of subsets of information on the sample. This list can, e.g., be a numeric list or can be graphically represented in form of a quantified spectrum. The list of subsets comprises a qualitative value for each subset information. This qualitative value is the validity value previously calculated. The list further contains a quantitative value for each subset of encoded information. This quantitative value is indicative for a concentration of one of the at least one constituent of the sample, the NMR signals of which form directly or indirectly part of the regarded subset of encoded information. It is not necessary to include each existing information subset of the information encoded in the first result into the list. Rather, the list can comprise only a part of all information encoded in the first result.

In an embodiment, the information on the sample and/or the information on the calibration sample inherently comprises information on at least one environmental influence that has been relevant during obtaining the respective NMR measurement results. The environmental influence is in particular chosen from the group consisting of pH, temperature, osmolarity, NMR magnet field stability and NMR detector stability.

In an embodiment, one does not try to minimize such environmental influence, but rather to measure the environmental influence as it is. Assuming that the environmental influence is the same upon measuring the sample and upon measuring the calibration sample, the effect of the environmental influence on the first result and on the second result can be assumed to be the same. Then, the conversion factor automatically accounts for the environmental influence upon applying the conversion factor to the first result. Thus, by means of the conversion factor, the environmental influence is automatically cancelled down without any need to otherwise considering this environmental influence.

In an embodiment, the sample properties such as pH, temperature and osmolarity are the same for the sample and the calibration sample.

In an embodiment, the quantitative value being indicative for a concentration of one of the at least one constituent of the sample is a concentration value in a SI unit. To give examples, mol/l, mmol/l, nmol/l and pmol/l are suited SI concentration units.

In an embodiment, the threshold is defined to differentiate significant ("good") validity values from insignificant ("bad") validity values. In an embodiment, each subset of encoded information having a validity value above a pre-defined threshold is considered as significant validity value that corresponds to a constituent-specific signal of the first result. If the validity value is below the pre-defined threshold, the respective subset of information is considered as being not specific for a certain constituent of the first result.

In an embodiment, the at least one constituent of the sample has an unknown identity when the first result is obtained. Thus, it is not necessary to identify the constituent prior to checking whether or not the information on this constituent in the first result can be well separated from other information contained in first result. Thus, a substance identification is not necessary at all for performing the instantly described method.

In an embodiment, the described method additionally comprises a step of identifying the at least one constituent of the sample and assigning the identified constituent to at least one of the subsets of information of the sample. In doing do, it is possible to work with clear names of at least some of the constituents making up the sample instead of using generic names such as constituent A, constituent B etc.

Usually, the concentration of the different constituents making up the sample is not known to a person performing an NMR analysis of the sample to obtain the first result. Thus, in an embodiment, the concentration of the at least one constituent is not known upon obtaining the first result. This makes the instantly described method feasible for almost any sample analysis. However, if the concentration of the at least one constituent is known to the person performing the NMR analysis of the sample or evaluating the first result, this does not negatively influence the method to be carried out.

In an embodiment, the first result is a measured free induction decay (FID) or a list of observed NMR signals. Thus, when carrying out the instantly described method, it is not necessary to perform a Fourier transformation on the FID to obtain an NMR spectrum. Rather, an NMR spectrum can be considered as auxiliary construction being necessary for manual NMR analysis. While the instantly described method can be well applied to NMR spectra, it also works without obtaining any spectrum, but rather by working with the obtained or provided NMR measurement in any other form.

In an embodiment, the first result is an NMR spectrum of the sample and the step of calculating the validity value is performed by several sub-steps. These sub-steps are a) defining a test criterion, b) applying the test criterion to at least one NMR line of the NMR spectrum of the sample, and c) determining how exactly the at least one NMR line of the NMR spectrum of the sample matches the test criteria. This is in contrast to prior art techniques in which the quality or goodness of an NMR line is regularly defined by a person performing the NMR analysis or NMR data evaluation based on his or her personal skill and experience, but not with respect to pre-defined test criteria. Thus, this embodiment enables the instantly described method to be applied in an automatic way to classic NMR spectra if such NMR spectra are to be used as NMR measurement result.

In an embodiment, the test criterion to be defined and applied is at least one of the group consisting of line width, line form and distance to an adjacent line.

In an embodiment, the first result and the second result a generated on the same NMR device. This makes it particularly easy to compensate for any influences of the NMR device on the measurement by applying the conversion factor to the first result, since in this embodiment the influences of the NMR device on the first result and the second result are expected to be the same so that their effect is encoded in the conversion factor. Generally, the described method is a device-independent method that can be carried out on NMR devices working at any frequency. Suited frequencies are frequencies in a range of 300 MHz to 1 GHz, such as 400 MHz, 500 MHz, 600 MHz, 700 MHz, 750 MHz, 800 MHz, 850 MHz, 900 MHz or 950 MHz.

The instantly described invention relates in an aspect also to an NMR measuring method as described herein. This NMR measuring method comprises a method for extracting information encoded in a result of an NMR measurement according to the preceding explanations. In addition, it comprises the steps explained in the following. First, a calibration result is obtained by performing an NMR measurement of a calibration sample by means of an NMR device using specific settings of the NMR device. Thereby, the calibration sample has a defined and known concentration of at least one constituent. An NMR spectrometer is a suited NMR device for performing this NMR measurement.

In a further method step, a sample result is obtained by performing an NMR measurement of a sample by means of the same NMR device, using the same settings of the NMR device as for obtaining the calibration result.

It is possible, to first obtain the calibration result or to first obtain the sample result. However, the NMR device settings should be the same in each case.

After a first sample result has been obtained, the step of obtaining a sample result is repeated for a plurality of samples so as to obtain a plurality of sample results.

In another method step, a conversion factor being indicative for a dependency between the information on the calibration sample encoded in the calibration result and the concentration of the at least one constituent of the calibration sample is calculated. This conversion factor is then applied to each obtained sample result. In doing so, the sample result can be multiplied by the conversion factor.

Afterwards, a validity value for at least one subset of the encoded information of the sample result is calculated for each sample result. This validity value is representative for a fitness of a first subset of the information encoded in the sample result to be separated from a second subset of the information encoded in the sample result.

Finally, the validity value is assigned to the subset of the information encoded in the sample result for which it was calculated. This step is done for each sample result previously obtained.

In an embodiment, the NMR measuring method comprises additional steps. In one of these additional steps, a control result is obtained. This is achieved by performing an NMR measurement of a first control sample by means of the NMR device using the same settings of the NMR device as for obtaining the calibration result. Thereby, the first control sample has a defined and known concentration with respect to at least one constituent. This step of obtaining the first control result is performed prior to obtaining the first sample result.

In this embodiment, the NMR measuring method comprises furthermore the additional step of obtaining a second control result by performing an NMR measurement of a second of a second control sample by means of the NMR device using the same settings of the NMR device as for obtaining the calibration result. Thereby, the second control sample has once again a defined and known concentration with respect to at least one constituent. The step of obtaining the second control sample is performed after the last sample result has been obtained.

In an embodiment, the step of obtaining the first control result is performed between obtaining the calibration result and the first sample result. Thus, a sequence of results to be obtained within an embodiment of the NMR measuring method could be the following:
calibration result
control result
first sample result
intermediate sample results
last sample result
second control result.

The number of sample results is not limited. A suited number of all sample results (including first and last sample result) is 2 to 1000, in particular 5 to 500, in particular 10 to 250, in particular 20 to 150, in particular 30 to 100, in particular 40 to 95, in particular 50 to 93, in particular 60 to 90, in particular 70 to 80.

In an embodiment, the calibration sample and at least one of the first control sample and the second control sample have an identical composition. In another embodiment, the first control sample and the second control sample have an identical composition. This reduces the work to be spent in producing the calibration sample and/or the control sample (s), but still allows for a highly accurate calibration of the whole NMR measuring method as well as for controlling the stability of the NMR device while carrying out the NMR measuring method.

Any of the before-mentioned alternative embodiments can be combined in any desired and sensible way. In addition, they can be applied to either of the described methods, even if they are only described with respect to one of the methods.

BRIEF DESCRIPTION OF THE DRAWING

Details of aspects of the present invention will be explained in the following with respect to an exemplary embodiment and an accompanying FIGURE. In the FIGURES:

FIG. 1 shows a table comprising different information subsets as example for a result obtained by an embodiment of the instant method.

DETAILED DESCRIPTION OF THE INVENTION

FIG. 1 shows a table-like list of information subsets, wherein a qualitative value in form of a validity value is assigned to each subset. In addition, a quantitative value in form of a concentration in mmol/l and thus in a SI unit is assigned to each subset.

In the exemplary embodiment of FIG. 1, each information subset corresponds to a specific line in an NMR spectrum so that a mean chemical shift can be assigned to the subset. Thus, each subset is characterized by a mean chemical shift that can be assigned to this information subset in the corresponding NMR spectrum. However, it is not necessary to transform the information of an NMR result into an NMR spectrum to differentiate individual information subsets. Rather, these information subsets can also be defined in other forms of representation of the underlying NMR result.

The validity value according to the exemplary embodiment of FIG. 1 can be between 0 (poor validity) up to 1 (good validity). A threshold of 0.75 was defined. Validity values lying above the range of 0.75 indicate that the respective information subset can be well separated from other information subsets that it has been compared with. Usually, the validity value is calculated for a first information subset lying adjacent to another information subset from which the first information subset should be separated.

Instantly, information subset A has a validity value of 0.90. This indicates that this information subset can be well separated from information subset B which is the information subset being most closely adjacent to information subset A if the information subsets are represented in a spectrum.

If the validity value would be below 0.75 (which is not the case for the information subsets represented in FIG. 1), the according information subset could not be well separated from the most adjacent information subset. Therefore, the respective information subset would not be suited to be associated with certain compounds nor with a certain concentration. Rather, it would represent somewhat unclear and thus undefined information that could not readily be evaluated in the respective NMR measuring result.

The instantly described method is a device-independent method. A quantification of a component of the sample can be done before this component is identified or can be completely skipped.

The invention claimed is:
1. An NMR measuring method, comprising the following steps:
   a) obtaining a calibration result by performing an NMR measurement of a calibration sample by means of an NMR device using specific settings of the NMR device, the calibration sample having a defined and known concentration with respect to at least one constituent,
   b) obtaining a first control result by performing an NMR measurement of a first control sample by means of the NMR device using the same settings of the NMR device as for obtaining the calibration result, the first control sample having a defined and known concentration with respect to at least one constituent,
   c) after having obtained the first control result, obtaining a sample result by performing an NMR measurement of a sample by means of the NMR device using the same settings of the NMR device as for obtaining the calibration result,
   d) repeating step c) for a plurality of samples,
   e) after having obtained the last sample result, obtaining a second control result by performing an NMR measurement of a second control sample by means of the NMR device using the same settings of the NMR device as for obtaining the calibration result, the second control sample having a defined and known concentration with respect to at least one constituent,
   f) controlling the stability of the NMR device during carrying out the NMR measuring method by comparing the second control result with the first control result,
   g) calculating a conversion factor being indicative for a dependency between NMR-encoded information on the calibration sample and the concentration of the at least one constituent of the calibration sample,
   h) performing the following method steps for each of the sample results:
      i) multiplying the respective sample result by the conversion factor so as to calibrate the respective sample result and to account for NMR measurement device specification,
      ii) calculating a validity value for at least one subset of the NMR-encoded information of the respective sample result, the validity value indicating whether or not a first subset of the NMR-encoded information can be well distinguished from a second subset of the NMR-encoded information, and
      iii) assigning the validity value to the subset of the NMR-encoded information for which it was calculated.

2. The NMR measuring method according to claim 1, wherein the calibration sample and at least one of the first control sample and the second control sample have an identical composition.

3. The method according to claim 1, wherein the first result is a measured free induction decay or a list of observed NMR signals.

4. The method according to claim 1, wherein the first result is an NMR spectrum of the sample and in that the step of calculating the validity value is carried out by defining a test criterion, by applying the test criterion to at least one NMR line of the NMR spectrum of the sample, and by determining how exactly the at least one NMR line of the NMR spectrum of the sample matches the test criterion.

5. The method according to claim 4, wherein the test criterion is at least one of the group consisting of line width, line form, distance to an adjacent line.

* * * * *

UNITED STATES PATENT AND TRADEMARK OFFICE
CERTIFICATE OF CORRECTION

PATENT NO. : 10,114,093 B2
APPLICATION NO. : 15/510484
DATED : October 30, 2018
INVENTOR(S) : Fritz Huber et al.

Page 1 of 1

It is certified that error appears in the above-identified patent and that said Letters Patent is hereby corrected as shown below:

In the Claims

Column 8, Line 6, Claim 1, delete "specification," and insert -- specifications, --

Signed and Sealed this
Twelfth Day of February, 2019

Andrei Iancu
*Director of the United States Patent and Trademark Office*